US011171659B1

(12) United States Patent
Yang et al.

(10) Patent No.: US 11,171,659 B1
(45) Date of Patent: Nov. 9, 2021

(54) TECHNIQUES FOR RELIABLE CLOCK SPEED CHANGE AND ASSOCIATED CIRCUITS AND METHODS

(71) Applicant: Micron Technology, Inc., Boise, ID (US)

(72) Inventors: Pu Yang, Boise, ID (US); Yantao Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/142,077

(22) Filed: Jan. 5, 2021

(51) Int. Cl.
*H03L 7/099* (2006.01)
*H03K 3/03* (2006.01)
*H03L 7/14* (2006.01)

(52) U.S. Cl.
CPC ............ *H03L 7/0991* (2013.01); *H03K 3/03* (2013.01); *H03L 7/146* (2013.01)

(58) Field of Classification Search
CPC .......... H03L 7/0991; H03L 7/146; H03K 3/03
USPC ........................................................ 327/141
See application file for complete search history.

(56) References Cited

U.S. PATENT DOCUMENTS

| 2002/0079943 | A1* | 6/2002 | Dubey | ................... | G06F 1/08 327/291 |
| 2003/0006813 | A1* | 1/2003 | Ishimi | ................... | G06F 1/04 327/141 |
| 2005/0022044 | A1* | 1/2005 | Shimosakoda | ........... | G06F 1/04 713/600 |
| 2009/0323457 | A1* | 12/2009 | Shod | .................... | G11C 7/1012 365/233.1 |
| 2013/0038359 | A1* | 2/2013 | Zhang | .................. | H03K 5/1252 327/141 |

* cited by examiner

*Primary Examiner* — Tomi Skibinski
(74) *Attorney, Agent, or Firm* — Perkins Coie LLP

(57) ABSTRACT

Techniques for reliable clock speed change and associated circuits and methods are disclosed. Internal voltage supplies of semiconductor devices may include oscillators and charge pump circuits. The oscillator may include at least two clock paths for generating clock signals having different clock frequencies, which can be provided to the charge pump circuit. Further, the oscillator may generate a reset signal configured to activate one clock path over the other (e.g., changing clock speeds). In some embodiments, the oscillator includes a flip-flop to align the reset signal with respect to an edge of an input clock signal supplied to the oscillator such that unintentional (undesired, unexpected) features in the output signal of the oscillator can be avoided when the oscillator changes clock speeds.

20 Claims, 6 Drawing Sheets

US 11,171,659 B1

TECHNIQUES FOR RELIABLE CLOCK SPEED CHANGE AND ASSOCIATED CIRCUITS AND METHODS

TECHNICAL FIELD

The present disclosure generally relates to semiconductor devices, and more particularly relates to techniques for reliable clock speed change and associated circuits and methods.

BRIEF DESCRIPTION OF THE DRAWINGS

The present disclosure will be understood more fully from the detailed description given below and from the accompanying drawings of various embodiments of the disclosure. The waveforms in the drawings are not necessarily to scale. Instead, emphasis is placed on illustrating clearly the principles of the present disclosure.

DETAILED DESCRIPTION

Figure 1A:
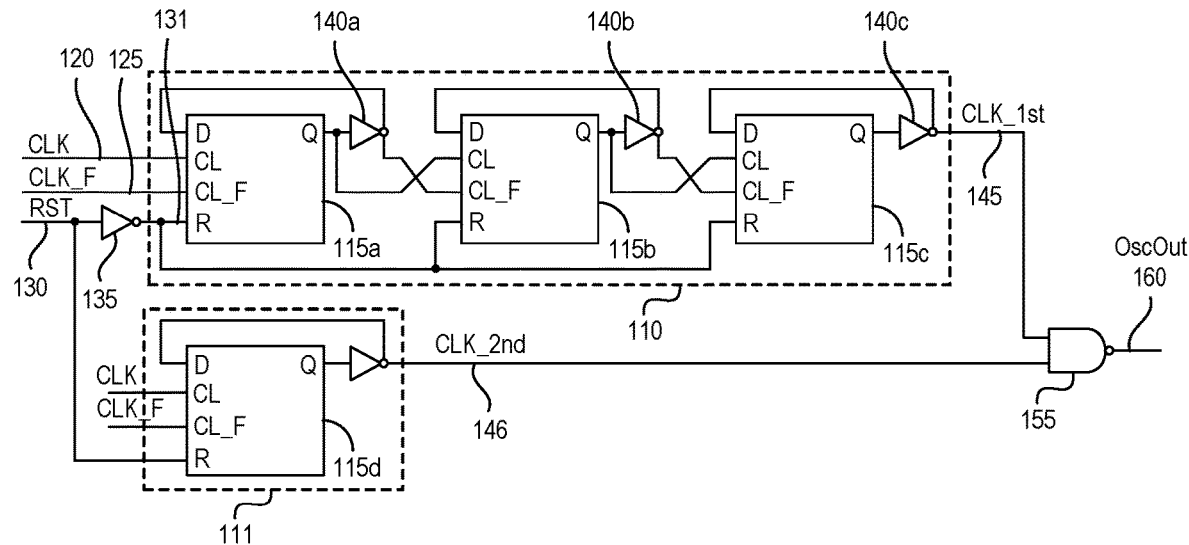
FIG. 1A is a block diagram illustrating an oscillator.

Semiconductor devices delivering high performance (e.g., high bandwidth, low power consumption) may include charge pump circuits to generate various internal voltages from external voltage/power supplies. Such a charge pump circuit may be coupled to an oscillator that generates an output to the charge pump to operate with more than one clock speed (e.g., a slow clock speed, a fast clock speed). For example, during power-up procedures of the semiconductor devices, the oscillator may generate a slow clock signal to the charge pump circuit such that the charge pump circuit (operating with the slow clock signal) may establish a required internal voltage in a dependable manner. After the power-up procedure, however, the oscillator may switch to generate a fast clock signal, which may be beneficial to reduce variations in the internal voltage. In other examples, the oscillator may switch to generate the slow clock signal from the fast clock if the semiconductor devices are operating in a power saving mode.

In some embodiments, the oscillator includes two (or more) clock paths that each has one or more flip-flops (e.g., D-type flip-flops) in a series. Flip-flops may also be referred to as latches. The clock paths may include different quantities of flip-flops to generate clock signals having different clock speeds—i.e., clock signals having different periods/frequencies. Further, the oscillator may receive a control signal with two or more logic states (e.g., two logic states of "0" and "1") devised to select one of the multiple (e.g., two) clock speeds—e.g., if the control signal corresponds to a logic state of "1," the oscillator outputs a fast clock signal (or vice versa). The control signal may also be referred to as a reset (RST) signal as it may be coupled to reset terminals of flip-flops of the clock paths. In some embodiments, the RST signal is not aligned with an input clock signal (e.g., a clock signal provided to the oscillator and flip-flops therein) because switching between the clock speeds may be random (e.g., asynchronous) with respect to the input clock signal.

In some cases, the control signal asynchronous to the input clock signal may results in undesired additional features (e.g., a transitions between logic levels, a phase shift by 180-degrees) in the output of the oscillator. The additional undesired features may cause the charge pump to perform one more charge pumping cycle, which may cause the internally generated voltage to exceed a desired level defined by a specification for the semiconductor devices. In some embodiments, the internal voltage greater than the specification may result in electrical stress to various semiconductor components (e.g., metal-oxide-semiconductor field effect transistors (MOSFETs)) operating under the internal voltage, rendering the components subject to reliability issues. In other embodiments, the unexpected phase shift in the output of the oscillator may result in failure of a delay-locked loop (DLL) circuit operation.

To address the foregoing challenges, embodiments of the present disclosure provide synchronizing (e.g., aligning) the control signal with an incoming edge of another signal such that the additional undesired features in the oscillator output can be prevented. In other words, the switching or transiting between two logic levels of the control signal (e.g., a reset signal) may be scheduled based on the next incoming edge of another signal (e.g., an input clock signal, an enable (OscEN) signal for the oscillator). For example, a flip-flop (latch) may be added such that the control signal can switch between the logic states aligned with the next incoming edge of the input clock signal. In this manner, the present disclosure, if applied to the oscillator coupled to the charge pump, the output voltage of the charge pump would be maintained within the specification when the clock speed of the oscillator changes (e.g., fast to slow, slow to fast). The present disclosure may be applied to other circuits that can benefit from reliable clock speed changes—e.g., DLL circuits, duty cycle correction circuits, clock frequency change circuits inside command decoders.

FIG. 1A is a block diagram schematically illustrating an oscillator 105. In the example embodiment of FIG. 1A, the oscillator 105 includes a slow clock path 110 and a fast clock path 111. Further, the slow clock path 110 is depicted to include three (3) flip-flops 115 (also identified individually as flip-flops 115a-c). Similarly, the fast clock path 111 is depicted to include one (1) flip-flop 115d. The slow clock path 110 is configured to receive an input clock signal (CLK 120), an inverted input clock signal (CLK_F 125), and an inverted reset signal (RST_F 131 generated through the inverter 135 receiving a reset signal (RST 130)) to generate a first clock signal (CLK_1st 145). Similarly, the fast clock path 111 is configured to receive the input clock signal (CLK 120), the inverted input clock signal (CLK_F 125, which may be regarded as complementary to CLK 120), and the reset signal (RST 130) to generate a second clock signal (CLK_2nd 146). The oscillator 105 also includes a logic gate 155 coupled to the first and second clock paths 110 and 111, and the logic gate 155 is configured to pass either the first clock signal (CLK_1st 145) or the second clock signal (CLK_2nd 146) as an output signal (OscOut 160) of the oscillator 105. In some embodiments, the logic gate 155 includes a not-AND (NAND) gate.

As illustrated in FIG. 1A, the flip-flops of the slow and fast clock paths can be D-type flip-flops. The D-type flip-flop includes an input terminal (denoted as D), an output terminal (denoted as Q), a first clock terminal (denoted as C), a second clock terminal (denoted as CL_F), and a reset terminal (denoted as R). Further, each flip-flop has its output terminal (Q) coupled to an inverter 140 (also identified individually as 140a-d), and the output of the inverter 140 is coupled (fed back) to the input terminal (D) the flip-flop.

The foregoing configuration of D-type flip-flop 115 and the inverter 140 can generate an output signal with a frequency corresponding to one-half of the frequency of the input clock signal (CLK 120), which can be regarded as a frequency divider. For example, if the period of CLK 120 is 5 nanosecond (nsec), the flip-flop 115a (and the inverter 140a) can generate an output signal with 10 nsec period. As the flip-flop 115a provides its output to the clock terminals of the flip-flop 115b, the flip-flop 115b can generate an output signal with 20 nsec period, and so on. In this regard, at least one flip-flop (e.g., the flip-flop 115a) of the slow clock path 110 is coupled to an immediately next flip-flop (e.g., the flip-flop 115b) of the slow clock path 110. Further, an output terminal (Q) of the at least one flip-flop is coupled to a first clock terminal (CL) of the immediately next flip-flop, and the output terminal of the at least one flip-flop is further coupled an inverter (e.g., the inverter 140a), and an output terminal of the inverter is coupled to a second clock terminal (CL_F) of the immediately next flip-flop.

Further, the oscillator 105 is configured to receive the reset signal (RST 130) and the inverted reset signal (RST_F 131) to activate either the slow clock path 110 or the fast clock path 111. For example, if RST 130 activates the slow clock path 110 (and deactivates the fast clock path 111), the oscillator 105 can generate its output with a frequency corresponding to one-eighth of the frequency of the input clock signal—e.g., if the period of CLK 120 is 5 nanosecond (nsec), the oscillator 105 can generate OscOut 160 with 40 nsec period. In this regard, an $N^{th}$ flip-flop of the slow clock path 110 may be configured to receive an $N^{th}$ clock signal, and to generate an $(N+1)^{th}$ clock signal for an $(N+1)^{th}$ flip-flop of the slow clock path 110, where N is a positive integer. Further, the $(N+1)^{th}$ flip-flop may be an immediately next flip-flop coupled to the $N^{th}$ flip-flop, and the $N^{th}$ clock signal has a first period that is one-half of a second period of the $(N+1)^{th}$ clock signal. Similarly, if RST 130 activates the fast clock path 111 (and deactivates the slow clock path 110), the oscillator 105 can generate its output with a frequency corresponding to one-half of the frequency of the input clock signal—e.g., if the period of CLK 120 is 5 nsec, the oscillator 105 can generate OscOut 160 with 10 nsec period.

Figure 1B:
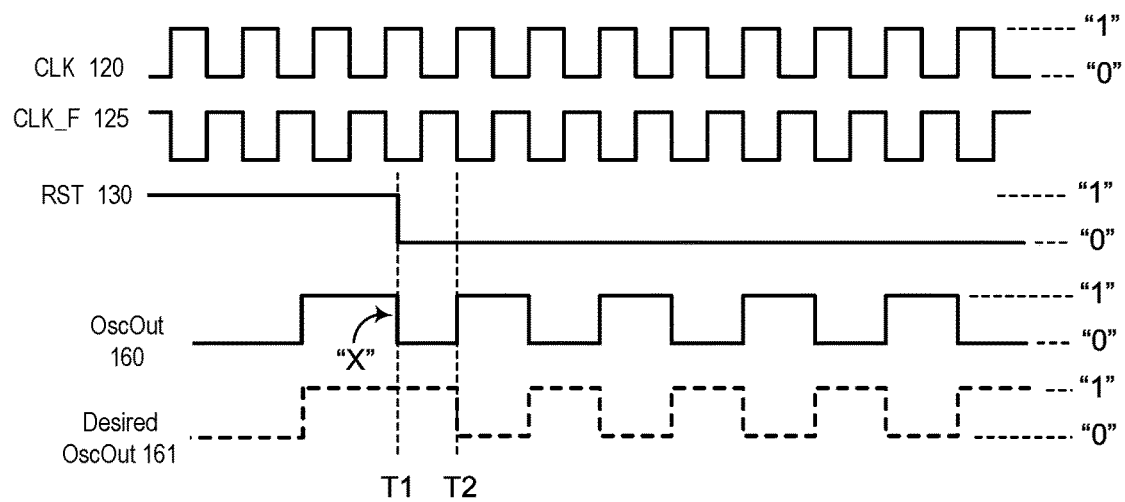
FIG. 1B illustrates waveforms of signals associated with the oscillator.

FIG. 1B illustrates various voltage waveforms of signals associated with the oscillator 105, namely the input clock signal (CLK 120), the inverted input clock signal (CLK_F 125), the reset signal (RST 130), and the output signal (OscOut 160). Moreover, FIG. 1B compares OscOut 160 in comparison to a desired (intended) output signal (OscOut 161). By way of example, CLK 120 has a period of 5 nsec. Prior to the time T1, the oscillator 105 generates OscOut 160 with 40 nsec period (with RST 130 corresponding to a logic state of 1)—e.g., the oscillator 105 operating with a slow clock speed. If the semiconductor device, at time T1, switches to operate with a fast clock speed, it may cause RST 130 to switch (toggle, transition) from the logic state 1 to a logic state of 0 at T1. Ideally, in response to the change in RST 130 at T1, the oscillator 105 is expected to switch to the fast clock speed and generate OscOut 160 with 10 nsec period after T1 (e.g., at time T2 and thereafter).

In some cases, however, the transition (switching, toggling) in RST 130 may not be synchronized with CLK 120 (e.g., the toggling in RST 130 is not aligned with a next incoming edge of CLK 120) as depicted in FIG. 1B. As RST 130 is coupled to the reset terminals of the flip-flops of the oscillator 105, the toggling in RST 130 would result in an undesired (e.g., unexpected, extra, additional) toggling, as indicated with "X" in OscOut 160 due to the transition in RST 130 that each individual flip-flops experiences. Such an undesired toggling in OscOut 160 would result in certain undesired consequences for various functional circuit blocks devised to receive OscOut 161 (the intended output signal). For example, if the oscillator 105 is coupled to a charge pump circuit, an additional undesired (unexpected, unintended) charge-pumping event may occur for an internal voltage supply, which in turn, may introduce reliability issues for semiconductor components coupled to the internal voltage supply as described in more detail with reference to FIG. 3. Further, the output signal (OscOut 160) exhibits a phase shift of 180-degrees when compared to the desired output signal (OscOut 161), which may cause various issues to a DLL circuit coupled to the oscillator 105, which expects to receive the desired output signal (OscOut 161).

Figure 2A:
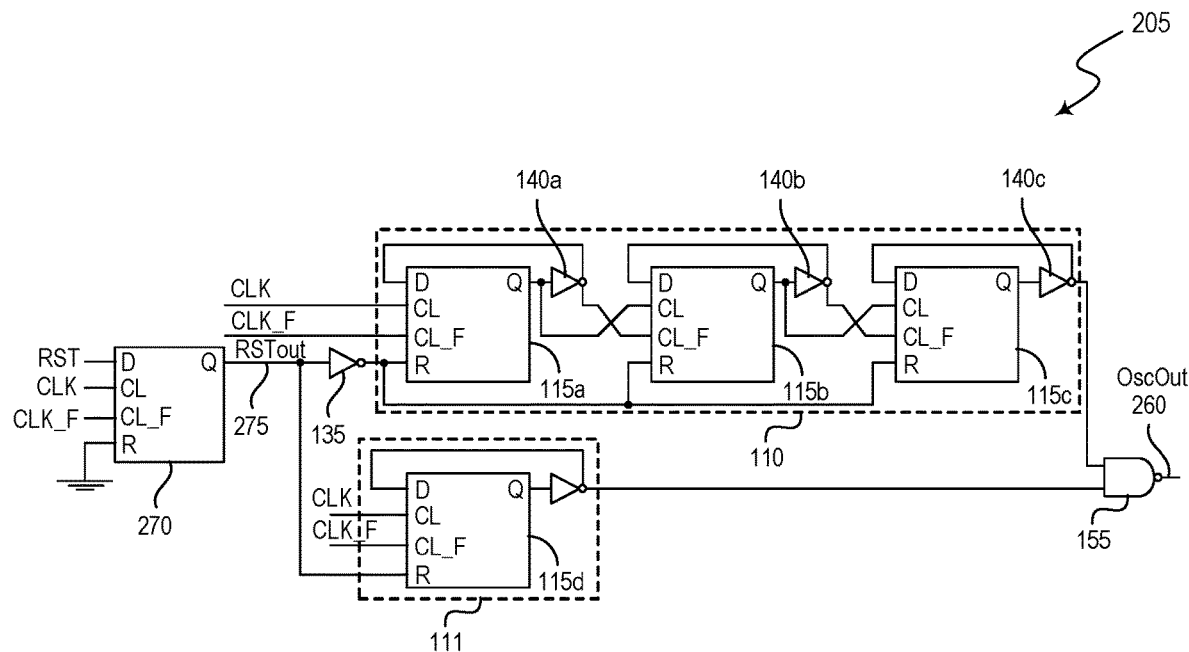
FIG. 2A is a block diagram illustrating an oscillator in accordance with embodiments of the present disclosure.

FIG. 2A is a block diagram schematically illustrating an oscillator 205 in accordance with embodiments of the present disclosure. The oscillator 205 includes aspects of the oscillator 105. For example, the oscillator 205 includes the slow clock path 110 and the fast clock path 111 described with reference to FIG. 1A. Further, the oscillator 205 includes a flip-flop 270 configured to receive CLK 120, CLK_F 125, and RST 130 to generate an output signal (RSTout 275). As illustrated in FIG. 2A, the flip-flop 270 can be a D-type ff. The output signal of the flip-flop 270 (RSTout 275) is synchronized with CLK 120 due to the fact that the input condition (at D) of the flip-flop 270 is copied to the output (Q) of the flip-flop 270 only when the clock input (e.g., CLK 120) is active (together with its reset terminal (R) coupled to the ground node). As such, in some cases, the flip-flop 270 may be referred to as a gating flip-flop (e.g., the input condition (RST 130) being copied (or transferred) to the output of the flop-flop 270 is "gated" by CLK 120).

Figure 2B:
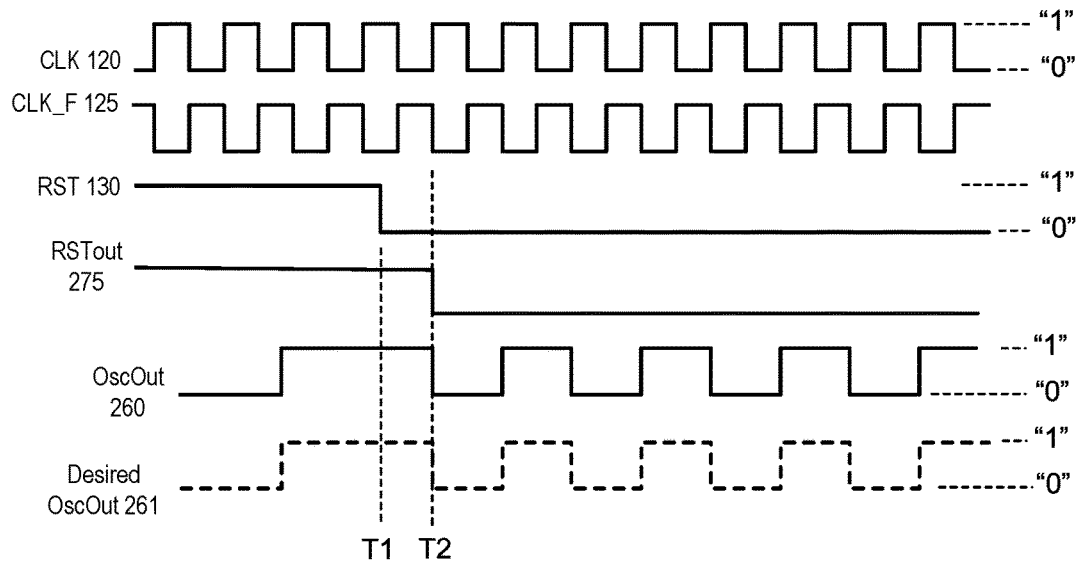
FIG. 2B illustrates waveforms of signals associated with the oscillator.

FIG. 2B illustrates various voltage waveforms of signals associated with the oscillator 205, namely the input clock signal (CLK 120), the inverted input clock signal (CLK_F 125), the reset signal (RST 130), the output signal of the flip-flop 270 (RSTout 275), and the output signal of the oscillator 205 (OscOut 260). Moreover, FIG. 2B compares OscOut 260 with a desired (intended) output signal (OscOut 261). By way of example, CLK 120 has a period of 5 nsec. Prior to the time T1, the 205 generates OscOut 260 with 40 nsec period (with RST 130 corresponding to a logic state of 1)—e.g., the oscillator 205 operating with a slow clock speed. If the semiconductor device, at time T1, switches to operate with a fast clock speed, it may cause RST 130 to switch (toggle, transition) from the logic state 1 to a logic state of 0 at T1. As shown in FIG. 2, the oscillator 205 may receive RST 130 (toggling from the logic state of 1 to a logic state of 0 at T1) at the flip-flop 270. The flip-flop 270 generates RSTout 275 that switches from the logic state of 1 to a logic state of 0 at time T2 such that RSTout 275 is synchronized with CLK 120 (e.g., the toggling in RSTout 275 being aligned to the edge of CLK 120). As such, RSTout 275 lags in time when compared to RST 130. In this manner, the oscillator 205 generates the output signal (OscOut 260)

without any undesired toggling and/or phase shift—e.g., reliably changing clock speeds. In other words, the output signal of the oscillator 205 (OscOut 260) matches with the desired output signal (OscOut 261).

Figure 3:
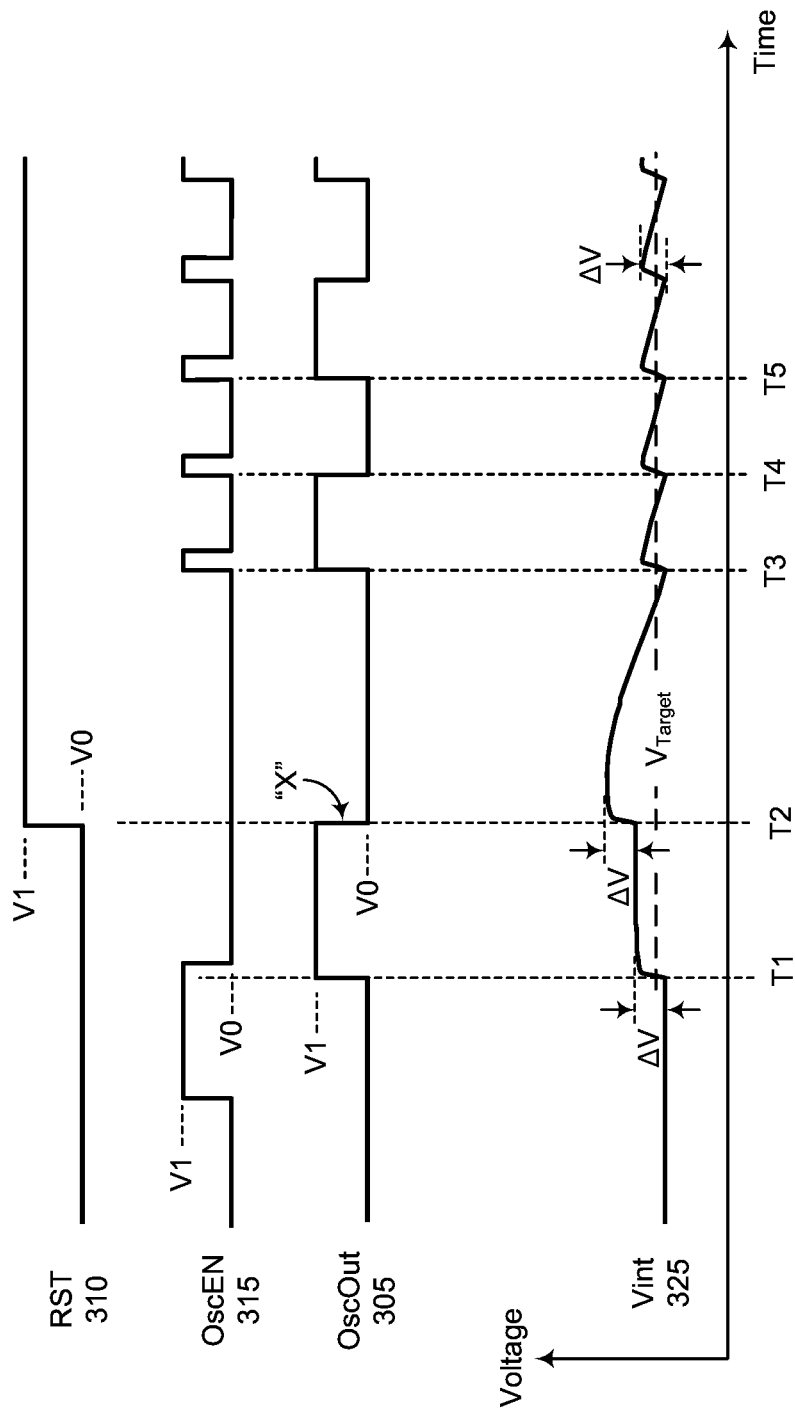
FIG. 3 illustrates waveforms of signals associated with a voltage generator including an oscillator and a charge pump circuit.

FIG. 3 illustrates voltage waveforms of signals associated with an oscillator (e.g., the oscillator 105 described with reference to FIGS. 1A and 1B) coupled to a voltage generator of a semiconductor device. The voltage generator, in conjunction with the oscillator, can generate various levels of internal voltages to provide the internal voltages to different functional circuit blocks and/or to optimize power performance of the semiconductor device. The waveforms of FIG. 3 describe how the voltage generator may maintain a desired internal voltage level, as well as issues associated with changing clock speeds of the oscillator coupled to the voltage generator.

By way of example, FIG. 3 depicts an output signal of the oscillator (OscOut 305, which may include aspects of OscOut 160), a reset signal for the oscillator (RST 330, which may include aspects of RST 130) configured to activate different clock speed paths of the oscillator (e.g., switching between the slow clock path 110 and the fast clock path 111 described with reference to FIGS. 1A and 1B), an enable signal (OscEN 315) that controls (enables) the oscillator (e.g., the oscillator outputting and/or toggling OscOut 305). The foregoing signals (and similar signals described with reference to FIGS. 4A and 4B) are indicated to have a logic state of "0" corresponding to a first voltage V0 and a logic state of "1" corresponding to a second voltage V1. In some embodiments, V0 is equal to 0V (or a ground node of the semiconductor device), and V1 is equal to 1.5 V (or other voltage level suitable for circuitry of the semiconductor device). Further, FIG. 3 depicts a voltage of an internal power/voltage supply (Vint 325) of the semiconductor device, coupled to the voltage generator. The internal power supply may also be referred to as an internal power/voltage bus of the semiconductor device.

The oscillator may be configured to generate at least two different clocks having different clock frequencies/periods—e.g., a slow clock speed and a fast clock speed described with reference to FIGS. 1A and 1B. For example, the oscillator is configured to generate OscOut 305 that has two different frequencies (periods)—e.g., before and after the time T2. In this regard, the oscillator may receive RST 330 that switches from V0 to V1 at time T2 to select (change) clock frequencies of OscOut 305. In the example waveforms depicted in FIG. 3, the oscillator operates to generate a slow clock signal prior to T2 while RST 330 corresponds to V0 (a logic state of "0"). After the time T2, the oscillator operates to generate a fast clock signal while RST 330 corresponds to V1 (a logic state of "1").

The voltage generator may include a charge pump circuit coupled to a power/voltage source (e.g., an external power/voltage supply). The charge pump circuit can be configured to accumulate charge over certain periods of time from the voltage source (e.g., an external voltage of 1V or less) such that the charge pump circuit can provide a voltage (e.g., Vint 325) greater than the external voltage. The charge pump circuit may operate based on receiving the output of the oscillator (e.g., OscOut 305). In some embodiments, the charge pump circuit includes two (2) pump cores that each operates during a portion (e.g., one-half) of a period of OscOut 305. For example, during a first time period when OscOut 305 corresponds to a logic state of 1, a first pump core may operate to accumulate charge. When OscOut 305 switches to a logic state of 0, the first pump core may share the charge that has been accumulated, with the internal voltage supply. As a result of sharing the charge, Vint 325 may increase by ΔV. During a second time period when OscOut 305 corresponds to a logic state of 0, a second pump core may operate to accumulate charge. Subsequently, the second pump core shares the charge that has been accumulated with the internal voltage supply to increase Vint 325 by ΔV when OscOut 305 switches back to the logic state of 1, and so on.

The internal voltage supply may be designed to maintain a target voltage (e.g., $V_{Target}$ of 1.5V) within a certain specified range (e.g., ±120 mV). In some embodiments, the range may be related to an amount of voltage that the charge pump provides to the internal voltage supply at each charge sharing event (e.g., ΔV, which can be approximately 120 mV). To maintain $V_{Target}$ of the internal voltage supply within the specified range, the voltage generator may include a voltage detector (sensor) configured to detect the voltage level (Vint 325) of the internal voltage supply decreasing (falling) below $V_{Target}$. The voltage detector may also be configured to generate OscEN 315 to "enable" the oscillator (and/or the voltage generator) whenever it detects Vint 325 becoming less than $V_{Target}$ such that charge sharing can increase Vint 325 above $V_{Target}$—e.g., by ΔV. For example, at T1, OscEN 315 is at V1 (the logic state of "1," active, high) and OscOut 305 switches from V0 to V1, triggering a charge sharing event such that Vint 325 is increased by ΔV. As a result, Vint 325 can increase to be greater than $V_{Target}$. Similarly, at T3, T4, and T5, each time after Vint 325 having decreased below $V_{Target}$, OscEN 315 switches from V0 to V1 (active), and OscOut 305 toggles (e.g., switch from V0 to V1, or vice versa) to restore (increase, boost) Vint 325 above $V_{Target}$.

As described herein, OscEn 315 is designed to control OscOut 305 (e.g., the oscillator is allowed to output (and/or toggle) OscOut 305 if the OscEn 315 is active at V1) such that Vint 325 can be "boosted" by the charge sharing events when Vint 325 decreases below $V_{Target}$. However, transitions in RST 330 may occur independent of Vint 325 (and thus, independent of OscEn 315). For example, at time T2, the semiconductor device may switch from the low clock speed to the high clock speed for the voltage generator (e.g., after completing initialization procedures), which is depicted as a transition in RST 330 at time T2 from V0 to V1. As such, if RST 330 is directly coupled to the oscillator (e.g., coupled to the reset terminals of the flip-flops as described with reference to FIGS. 1A and 1B), the transition in RST 330 would result in an undesired transition (toggling) denoted as "X" at time T2 in OscOut 305 even when OscEn 315 is not active.

Such an undesired toggling in OscOut 305 would result in the charge pump to share the charge with the internal voltage supply at T2. As a result, the additional increase in Vint 325 by ΔV at T2 may cause Vint 325 to exceed the allowed voltage range (e.g., $V_{Target}$+ΔV) due to the undesired toggling at time T2 in OscOut 305. For example, Vint 325 may reach approximated 1.7 V or so, which is greater than the upper limit of 1.62 V due to two charge sharing events, one of which occurs at T2, while Vint 325 is greater than $V_{Target}$. Such a voltage excursion in the internal power/voltage supply would result in extra electrical stress to various components (e.g., MOSFETs with a relatively thin gate oxide) operating with Vint 325, which in turn, may cause reliability issues for the semiconductor device.

Figure 4A:
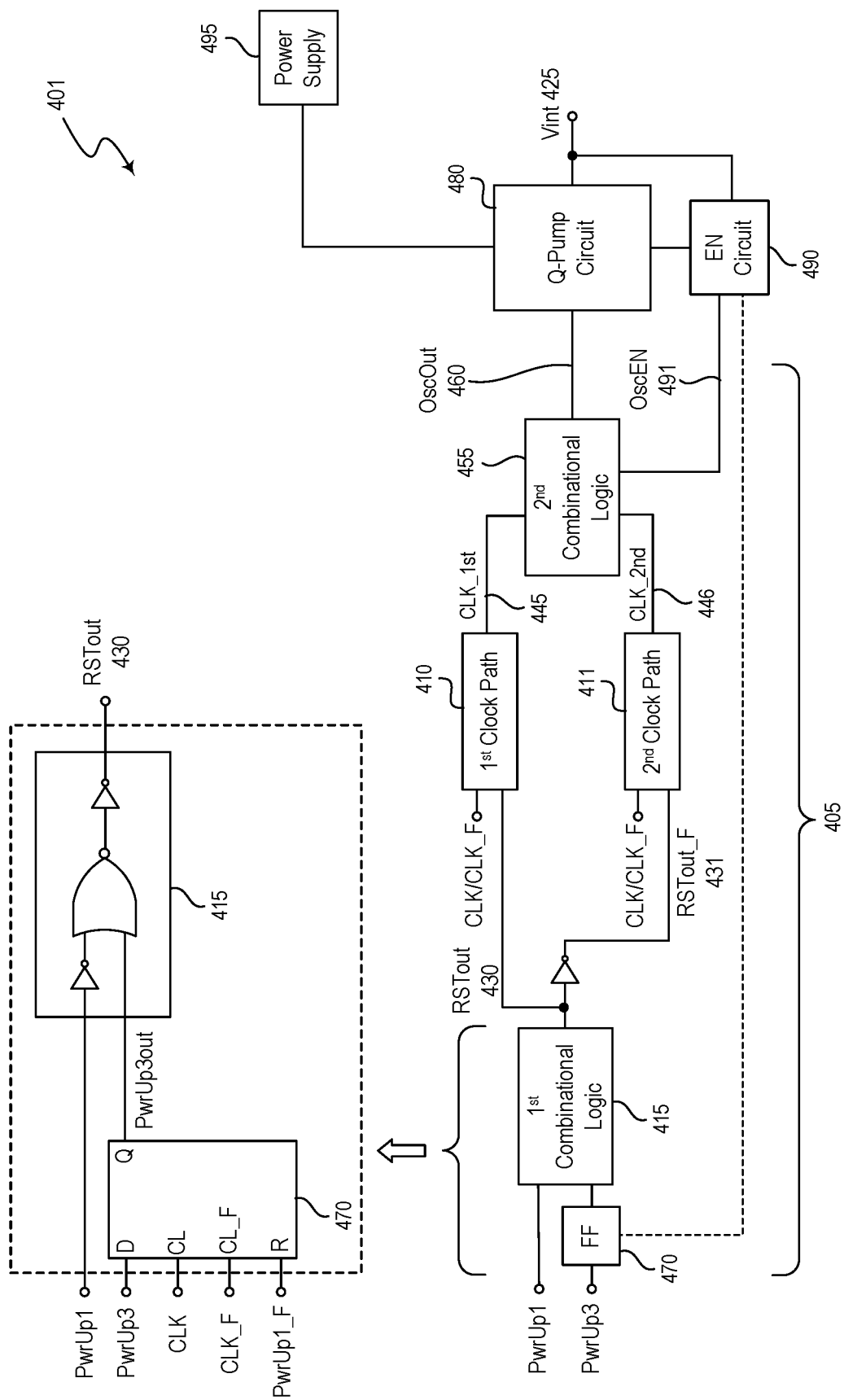
FIG. 4A is a block diagram of a voltage generator including an oscillator and a charge pump circuit in accordance with embodiments of the present disclosure.

FIG. 4A is a block diagram 401 of a voltage generator of a semiconductor device, which includes an oscillator 405 coupled to a charge pump circuit 480 in accordance with embodiments of the present disclosure. In some embodiments, the charge pump circuit 480 (e.g., the charge pump circuit described herein with reference to FIG. 3) is coupled to a power supply 495 (e.g., an external power supply). The oscillator 405 may include aspects of the oscillator 105 and/or the oscillator 205. For example, the oscillator 405 includes a first clock path 410 (e.g., the slow clock path 110 described with reference to FIG. 1A) and a second clock path 411 (e.g., the fast clock path 111 described with reference to FIG. 1A). The first clock path 410 is configured to receive CLK 120, CLK_F 125, and RSTout 430 (described in more detail with reference to FIG. 4B, which may include aspects of RSTout 275) to generate a first clock signal (CLK_1st 445, which may include aspects of CLK_1st 145). Similarly, the second clock path 411 is configured to receive CLK 120, CLK_F 125, and RSTout_F 431 (i.e., inverted RSTout 430, which is complementary to RSTout 430) to generate a second clock signal (CLK_2nd 446, which may include aspects of CLK_2nd 146).

Further, the oscillator 405 includes a second combinational logic 455 coupled to the first and second clock paths 410 and 411, and configured to generate an output of the oscillator 405 (OscOut 460, which may include aspects of OscOut 260). In some embodiments, OscOut 460 is related to (e.g., corresponds to) either CLK_1st 445 (e.g., if the first clock path 411 is active) or CLK_2nd 446 (e.g., if the second clock path 412 is active). Further, the second combinational logic 455 may be configured to receive an enable signal (OscEN 491, which may include aspects of OscEN 315) that controls (enables) certain functional characteristics of the oscillator (e.g., the oscillator 405 outputting and/or toggling OscOut 460). For example, the oscillator 405 provides OscOut 460 (e.g., toggles OscOut 460) to the charge pump circuit 480 when OscEN 491 is active—e.g., when Vint 425 needs to be increased. To this end, the voltage generator of FIG. 4A includes an enabling circuit (EN circuit 490) generating OscEN 491 as a result of monitoring a voltage (Vint 425, which includes aspects of Vint 325 described with reference to FIG. 3) of an internal voltage/power supply (bus) coupled to the charge pump circuit 480. The EN circuit 490 may include a voltage sensing component to detect Vint 425 falling below a target voltage level (e.g., $V_{Target}$ described with reference to FIG. 3) and to bring OscEN 491 to a logic state of "1" (corresponding to V1).

Moreover, the oscillator 405 includes a first combinational logic 415 configured to generate RSTout 430 based on two signals, PwrUp1 and PwrUp3, which in combination, determine operating characteristics of the oscillator 405. For example, if both PwrUp1 and PwrUp3 correspond to a logic state of "0" (corresponding to V0, prior to the time T1 in FIG. 4B), the oscillator 405 may be inactive regardless of the status of RSTout 430. Maintaining the oscillator 405 inactive may be advantageous in certain circumstances. For example, if an external power supply (e.g., power supply 495) coupled to the voltage generator is unstable (e.g., during a power-up procedure for the semiconductor device), the semiconductor device may keep the voltage generator (i.e., the oscillator 405) inactive. In other examples, the semiconductor device may include multiple voltage generators, each drawing current from the power supply (e.g., power supply 495). As such, the semiconductor device may selectively activate (or deactivate) certain voltage generator(s) coupled to the power supply to optimize overall power consumption based on various functional modes of the semiconductor device. Further, in some embodiments, if the oscillator 405 is inactive (e.g., both PwrUp1 and PwrUp3 correspond to V0), Vint 425 may be maintained at a fixed voltage (Vc)—e.g., by using a voltage clamp circuit.

Figure 4B:
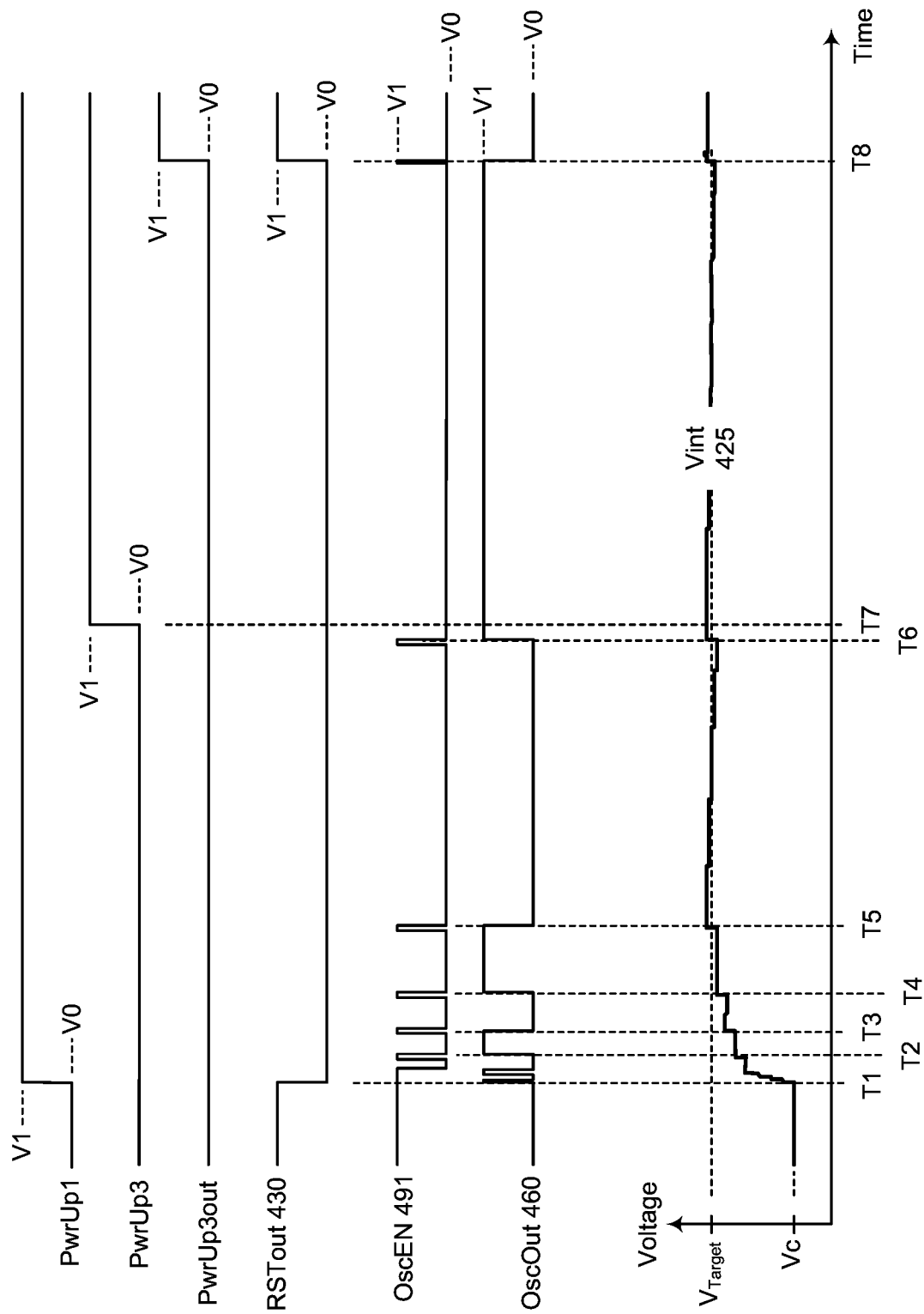
FIG. 4B illustrates waveforms of signals associated with the voltage generator.

If PwrUp1 corresponds to a logic state of "1" and PwrUp3 corresponds to a logic state of "0," the oscillator 405 may operate to generate a clock signal with a slow clock speed—e.g., the first clock path 410 is active to generate CLK_1st 445. As shown in FIG. 4B, PwrUp1 may toggle from V0 to V1 at the time T1 to have the oscillator 405 start operating to generate the slow clock signal (from being inactive). In response to the change in PwrUp1, the first combinational logic 415 generates RSTout 430 corresponding to V0. As such, the oscillator 405 may be active with the first clock path 410—e.g., through RSTout 430 coupled to the reset terminals of the flip-flops in the first clock path 410. In some embodiments, the voltage generator may have the oscillator 405 operate with such a slow clock speed to ensure proper and reliable ramping up of the internal power/voltage supply—e.g., from Vc to $V_{Target}$. To this end, the EN circuit 490 may have OscEN 491 active at V1 (e.g., after T1, at T2, T3, T4, T5, and T6, respectively) such that the oscillator 405 can provide OscOut 460 (e.g., toggling OscOut 460 when OscEN 491 is active) to the charge pump circuit 480. As a result, the charge pump circuit 480 can increase Vint 425 in response to OscOut 460 toggling between V0 and V1 (or vice versa)—e.g., by ΔV per charge sharing event as described with reference to FIG. 3.

In some embodiments, the EN circuit 490 may bring OscEN 491 to V0 (e.g., inactive) after the charge sharing events—e.g., between T2 and T3, between T3 and T4, between T4 and T5, etc. In some cases, such intervals in OscEN 491 corresponding to V0 between the charge sharing events facilitate the EN circuit 490 to reliably determine (sense) Vint 425 of the internal voltage/power supply (bus) coupled to the charge pump circuit 480—e.g., after certain delay in stabilizing Vint 425 after the charge sharing events in view of a capacitance associated with the internal voltage/power supply (bus) coupled at the output node of the charge pump circuit 480.

If both PwrUp1 and PwrUp3 corresponds to a logic state of "1," the oscillator 405 may operate to generate a clock signal with a fast clock speed—e.g., the second clock path 411 is active to generate CLK_2nd 446. As shown in FIG. 4B, PwrUp3 may toggle from V0 to V1 at the time T7 T1 to have the oscillator 405 start operating to generate the fast clock signal (from operating to generate the slow clock signal, i.e., changing clock speeds from low to high). If PwrUp3 is directly coupled to the first combinational logic 415 (i.e., without the flip-flop 470), the first combinational logic 415 would have caused RSTout 430 to toggle from V0 to V1 at T7, in response to PwrUp3 toggling from V0 to V1. Such a transition in RSTout 430 (coupled to the reset terminals of the first and second clock paths) would have caused an unintended toggling in OscOut 460 at time T7, similar to the undesired transition (toggling) denoted as "X" at time T2 in OscOut 305 described with reference to FIG. 3. In view of the charge sharing event at T6, the unintended charge sharing at T7 (which may occur when Vint 425 is greater than $V_{Target}$) might have brought Vint 425 above a certain specified range (e.g., $V_{Target} \pm \Delta V$), which in turn, may result in the reliability issues described with reference to FIG. 3.

The oscillator 405 includes the flip-flop 470 such that PwrUp3 may be "buffered" through the flip-flop 470 to prevent RSTout 430 to toggle in response to PwrUp3 toggling from V0 to V1. Further, OscEN 491 may control the flip-flop 470 by controlling CLK 120 and/or CLK_F 125, as indicated by a dashed line between the flip-flop 470 and the EN circuit 490. In some embodiments, CLK 120 (and/or CLK_F 125) may become active only when OscEN 491 is active (e.g., at V1). In this manner, PwrUp3_out (at the output terminal Q of the flip-flop 470) is aligned with the next incoming edge of OscEN 491, and thus RSTout 430 can be aligned with OscEN 491 at the time T8 although PwrUp3 toggles at T7. Further, at T8, OscOut 460 may toggle while OscEN 491 is active to trigger a charge sharing event for the charge pump circuit 480 to bring Vint 425 above $V_{Target}$. In this manner, the oscillator 405 may operate to generate the clock signal with a slow clock speed (e.g., CLK_1st 445) during time period between T1 and T8, although PwrUp3 toggles from V0 to V1 at T7 independent of Vint 425 (and OscEN 491). Having the flip-flop 470 to "buffer" PwrUp3 such that PwrUp3out (aligned with the next incoming edge of OscEN 491 through controlling the clock signal provided to the flip-flop 470) can generate RSTout 430 aligned with OscEN 491 to avoid the undesired feature(s) in OscOut 460.

Figure 5:
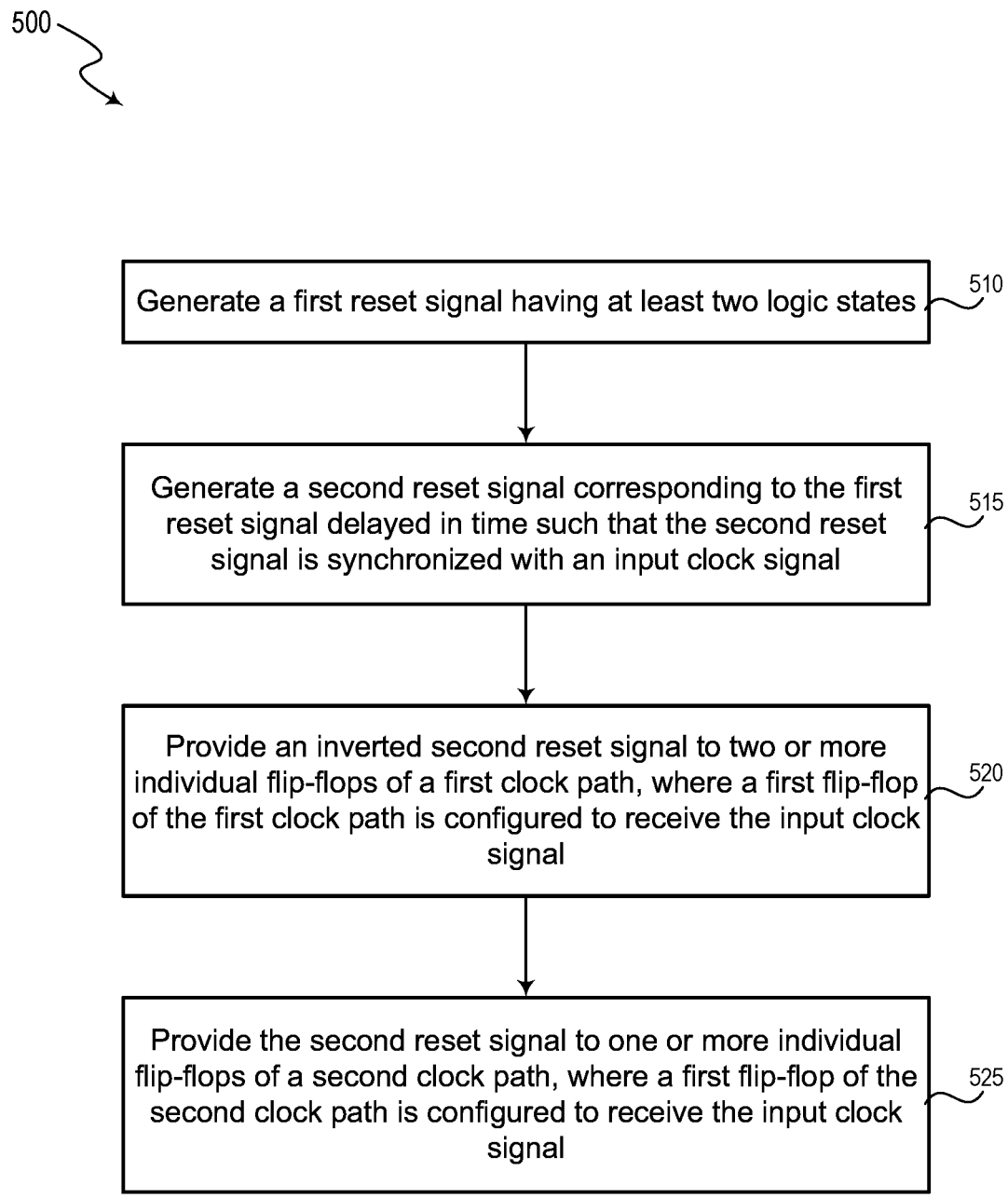
FIG. 5 is a flowchart illustrating a method of reliably changing a clock speed according to embodiments of the present disclosure.

FIG. 5 is a flowchart 500 illustrating a method of reliably changing a clock speed according to embodiments of the present disclosure. The flowchart 500 may be an example of or include aspects of a method that a voltage supply (e.g., an internal voltage supply including an oscillator and a charge pump circuit) may perform as described with reference to FIGS. 2, 4A, and 4B.

The method includes generating a first reset signal having at least two logic states (box 510). In accordance with one aspect of the present technology, the generating feature of box 510 can be performed by the voltage supply, as described with reference to FIGS. 2, 4A, and 4B.

The method further includes generating a second reset signal corresponding to the first reset signal delayed in time such that the second reset signal is synchronized with an input clock signal (box 515). In accordance with one aspect of the present technology, the generating feature of box 515 can be performed by the voltage supply, as described with reference to FIGS. 2, 4A, and 4B.

The method further includes providing an inverted second reset signal to two or more individual flip-flops of a first clock path, where a first flip-flop of the first clock path is configured to receive the input clock signal (box 520). In accordance with one aspect of the present technology, the providing feature of box 520 can be performed by the voltage supply, as described with reference to FIGS. 2, 4A, and 4B.

The method further includes providing the second reset signal to one or more individual flip-flops of a second clock path, where a first flip-flop of the second clock path is configured to receive the input clock signal (box 525). In accordance with one aspect of the present technology, the providing feature of box 525 can be performed by the voltage supply, as described with reference to FIGS. 2, 4A, and 4B.

In some embodiments, the second reset signal is generated by a D-type flip-flop including an input terminal configured to receive the first reset signal, an output terminal configure to output the second reset signal, and a first clock terminal configured to receive the input clock signal.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

Those skilled in the art will appreciate that the components, blocks, and steps illustrated in FIGS. 1A through 5 described above, may be altered in a variety of ways. For example, the order of the logic may be rearranged, substeps may be performed in parallel, illustrated logic may be omitted, other logic may be included, etc. In some implementations, one or more of the components described above can execute one or more of the processes described below.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

Reference in this specification to "implementations" (e.g. "some implementations," "various implementations," "one implementation," "an implementation," "some embodiments," etc.) means that a particular feature, structure, or characteristic described in connection with the implementation is included in at least one implementation of the disclosure. The appearances of these phrases in various places in the specification are not necessarily all referring to the same implementation, nor are separate or alternative implementations mutually exclusive of other implementations. Moreover, various features are described which may be exhibited by some implementations and not by others. Similarly, various requirements are described which may be requirements for some implementations but not for other implementations.

As used herein, being above a threshold means that a value for an item under comparison is above a specified other value, that an item under comparison is among a certain specified number of items with the largest value, or that an item under comparison has a value within a specified top percentage value. As used herein, being below a threshold means that a value for an item under comparison is below a specified other value, that an item under comparison is among a certain specified number of items with the smallest value, or that an item under comparison has a value within a specified bottom percentage value. As used herein, being within a threshold means that a value for an item under comparison is between two specified other values, that an item under comparison is among a middle specified number of items, or that an item under comparison has a value within a middle specified percentage range. Relative terms, such as high or unimportant, when not otherwise defined, can be understood as assigning a value and determining how that value compares to an established threshold. For example, the phrase "selecting a fast connection" can be understood to mean selecting a connection that has a value assigned corresponding to its connection speed that is above a threshold.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. An apparatus, comprising:
    a gating flip-flop configured to generate a first reset signal synchronized with an input clock signal based, at least in part, on receiving the input clock signal and a second reset signal;
    a first clock path coupled to the gating flip-flop, the first clock path including a first quantity of flip-flops, and configured to generate a first clock signal in response to receiving the input clock signal and an inverted first reset signal; and
    a second clock path coupled to the gating flip-flop, the second clock path including a second quantity of flip-flops, and configured to generate a second clock signal in response to receiving the input clock signal and the second reset signal.

2. The apparatus of claim 1, further comprising:
    a logic gate coupled to the first and second clock paths, the logic gate configured to pass either the first clock signal or the second clock signal as an output of the apparatus.

3. The apparatus of claim 2, wherein the logic gate corresponds to a not-AND (NAND) gate.

4. The apparatus of claim 1, further comprising:
    an inverter having an input terminal coupled to the gating flip-flop to receive the first reset signal and an output terminal coupled to a reset terminal of at least one flip-flop of the first clock path.

5. The apparatus of claim 1, wherein at least one flip-flop of the second clock path includes a reset terminal coupled to the gating flip-flop to receive the first reset signal.

6. The apparatus of claim 1, wherein the gating flip-flop corresponds to a D-type flip-flop including:
    an input terminal configured to receive the second reset signal;
    an output terminal configure to output the first reset signal;
    a first clock terminal configured to receive the input clock signal;
    a second clock terminal configured to receive an inverted input clock signal; and
    a reset terminal coupled to a ground node.

7. The apparatus of claim 1, wherein each flip-flop of the first and second clock paths corresponds to a D-type flip-flop having an output terminal coupled to an input terminal of an inverter, and an input terminal coupled to an output terminal of the inverter.

8. The apparatus of claim 1, wherein at least one flip-flop of the first clock path is coupled to an immediately next flip-flop of the first clock path, and wherein:
    an output terminal of the at least one flip-flop is coupled to a first clock terminal of the immediately next flip-flop; and
    the output terminal of the at least one flip-flop is further coupled an inverter, and an output terminal of the inverter is coupled to a second clock terminal of the immediately next flip-flop.

9. The apparatus of claim 1, wherein an $N^{th}$ flip-flop of the first clock path is configured to receive an $N^{th}$ clock signal, and to generate an $(N+1)^{th}$ clock signal for an $(N+1)^{th}$ flip-flop of the first clock path, N being a positive integer, wherein:
    the $(N+1)^{th}$ flip-flop is an immediately next flip-flop coupled to the $N^{th}$ flip-flop; and the $N^{th}$ clock signal has a first period that is one-half of a second period of the $(N+1)^{th}$ clock signal.

10. The apparatus of claim 1, wherein:
the second reset signal is asynchronous to the input clock signal; and
the first reset signal lags in time when compared to the second reset signal.

11. The apparatus of claim 1, wherein:
the first quantity is greater than the second quantity; and
the first clock signal has a first period that is greater than a second period of the second clock signal.

12. A voltage generator, comprising:
a charge pump circuit coupled to a power supply having a first voltage, and configured to generate a second voltage different than the first voltage based, at least in part, on receiving an output of an oscillator coupled to the charge pump circuit, wherein:
the oscillator includes:
a gating flip-flop configured to generate a first signal synchronized with an input clock signal based, at least in part, on receiving the input clock signal, a second signal, and a third signal;
a first combinational logic configured to receive an inverted third signal and the first signal from the gating flip-flop, and to generate a reset signal that is synchronized with an enable signal for the oscillator;
a first clock path coupled to the first combinational logic, the first clock path including a first quantity of flip-flops, and configured to receive the input clock signal and the reset signal;
a second clock path coupled to the first combinational logic, the second clock path including a second quantity of flip-flops, and configured to receive the input clock signal and an inverted reset signal; and
a second combinational logic coupled to the first and second clock paths, the second combinational logic configured to generate the output of the oscillator if the enable signal is active.

13. The voltage generator of claim 12, wherein the input clock signal is active only if the enable signal is active.

14. The voltage generator of claim 12, wherein the gating flip-flop corresponds to a D-type flip-flop including:
an input terminal configured to receive the second signal;
an output terminal configure to output the first signal;
a first clock terminal configured to receive the input clock signal;
a second clock terminal configured to receive an inverted input clock signal; and
a reset terminal configured to receive the third signal.

15. The voltage generator of claim 12, wherein:
if both the inverted third signal and the second signal correspond to a logic state of 0, the oscillator is inactive;

if the inverted third signal corresponds to a logic state of 1 and the second signal corresponds to a logic state of 0, the first clock path of the oscillator is active; or
if both the inverted third signal and the second signal correspond to a logic state of 1, the second clock path of the oscillator is active.

16. The voltage generator of claim 12, wherein each flip-flop of the first and second clock paths corresponds to a D-type flip-flop having an output terminal coupled to an input terminal of an inverter, and an input terminal coupled to an output terminal of the inverter.

17. The voltage generator of claim 12, wherein at least one flip-flop of the first clock path is coupled to an immediately next flip-flop of the first clock path, and wherein:
an output terminal of the at least one flip-flop is coupled to a first clock terminal of the immediately next flip-flop; and
the output terminal of the at least one flip-flop is further coupled an inverter, and an output terminal of the inverter is coupled to a second clock terminal of the immediately next flip-flop.

18. The voltage generator of claim 12, wherein the first and second clock paths generate first and second clock signals, respectively, and wherein:
the first quantity is greater than the second quantity; and
the first clock signal has a first period that is greater than a second period of the second clock signal.

19. A method, comprising:
generating a first reset signal having at least two logic states;
generating a second reset signal corresponding to the first reset signal delayed in time such that the second reset signal is synchronized with an input clock signal;
providing an inverted second reset signal to two or more individual flip-flops of a first clock path, wherein a first flip-flop of the first clock path is configured to receive the input clock signal; and
providing the second reset signal to one or more individual flip-flops of a second clock path, wherein a first flip-flop of the second clock path is configured to receive the input clock signal.

20. The method of claim 19, wherein the second reset signal is generated by a D-type flip-flop including:
an input terminal configured to receive the first reset signal;
an output terminal configure to output the second reset signal; and
a first clock terminal configured to receive the input clock signal.

* * * * *